United States Patent [19]

Sakakibara et al.

[11] Patent Number: 4,918,536
[45] Date of Patent: Apr. 17, 1990

[54] FACSIMILE RECORDING SYSTEM USING PHOTOSENSITIVE MICROCAPSULE RECORDING MEDIUM

[75] Inventors: Kenji Sakakibara, Ichinomiya; Jun Sakai, Nagoya; Shigeyuki Hayashi, Nagoya; Michitoshi Akao, Nagoya; Satoshi Furukawa, Suzuka; Eiji Fujii, Gifu, all of Japan

[73] Assignee: Brother Kogyo Kabushiki Kaisha, Japan

[21] Appl. No.: 263,264

[22] Filed: Oct. 27, 1988

[30] Foreign Application Priority Data

Mar. 4, 1986 [JP] Japan .................. 61-47018
Jun. 2, 1986 [JP] Japan .................. 61-82508
Jun. 13, 1986 [JP] Japan .................. 61-136187
Oct. 30, 1987 [JP] Japan .................. 62-167638[U]

[51] Int. Cl.⁴ .................................. G01D 9/42
[52] U.S. Cl. .................... 358/296; 346/110 R; 358/75; 430/138; 355/295
[58] Field of Search ............ 358/296, 302, 75; 346/110 R, 108, 160, 107 R; 430/138; 355/20, 32, 228, 229, 232, 295

[56] References Cited

U.S. PATENT DOCUMENTS

| | | | |
|---|---|---|---|
| 4,530,080 | 7/1985 | Aoi et al. ............... | 346/76 L |
| 4,639,127 | 1/1987 | Beery ..................... | 346/160 |
| 4,796,036 | 1/1989 | Misono ................... | 346/110 R |
| 4,801,949 | 1/1989 | Misono ................... | 346/108 |
| 4,806,446 | 2/1989 | Hatta ...................... | 430/138 |

FOREIGN PATENT DOCUMENTS 1512484  6/1978  United Kingdom .
2135468  8/1984  United Kingdom .
2159973 12/1985  United Kingdom .

Primary Examiner—Bruce A. Reynolds
Assistant Examiner—Scott A. Rogers
Attorney, Agent, or Firm—Oliff & Berridge

[57] ABSTRACT

An image recording system including a photosensitive medium having a layer of microcapsules formed on a substrate, each of the microcapsules having a photosensitive resin which is curable upon exposure to a radiation, and a colorless chromogenic material or color former which is capable of chemically reacting with a developer material, to form a visible image. The system further includes an exposing device for forming a latent image on the photosensitive medium according to image signals, by exposure of the medium to the radiation. The latent image is developed into a visible image. A communication device is provided for translating facsimile signals into corresponding picture signals. The facsimile signals are received from a remote facsimile transmitter through a communication channel and represent an image of a subject copy. Control means are connected to the communication device and the exposing device, for applying to the exposing device the picture signals received from the communication device as the image signals, to thereby form on the photosensitive medium the latent image represented by the picture signals.

16 Claims, 12 Drawing Sheets

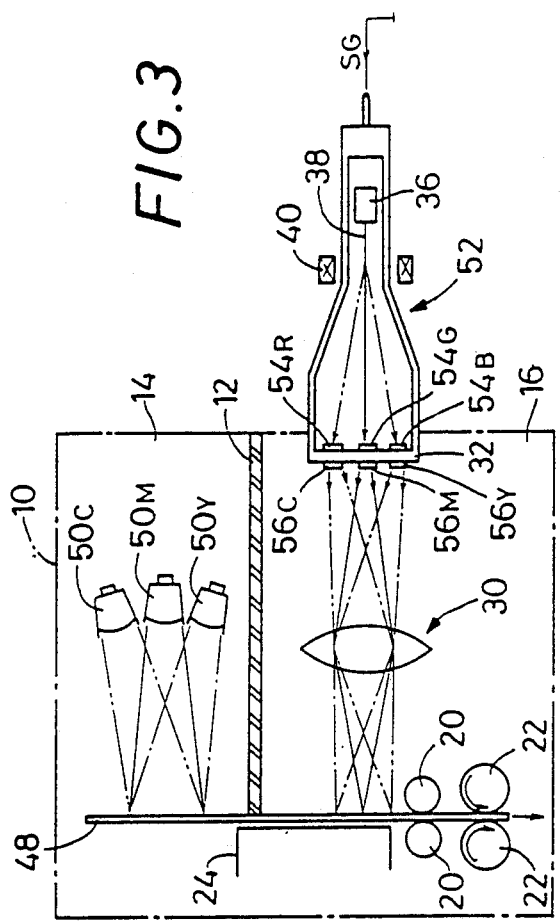

FACSIMILE RECORDING SYSTEM USING PHOTOSENSITIVE MICROCAPSULE RECORDING MEDIUM

BACKGROUND OF THE INVENTION

1. Field of the Invention

The present invention relates generally to an image recording system, and more particularly to a technique for improving the durability of an exposing device of the system for exposing a photosensitive medium to a radiation.

2. Discussion of the Prior Art

There is known an image transfer system using a photosensitive material as a recording medium, on which images are formed with a density that is varied in a certain range according to a variation in an amount of light exposure of the photosensitive material. The lower limit of the range in which the density is variable is determined as a basic minimum amount of light exposure necessary to produce an image visible to the unaided eye. In this type of an image transfer system, images are transferred to the photosensitive medium by exposing the medium to a radiation in response to appropriate image signals. An example of such an image transfer system is schematically illustrated in FIG. 5. In the figure, reference numeral 90 generally indicate a CRT (cathode ray tube) which has a faceplate 92, a fluorescent screen 94 disposed inside the faceplate 92, and an electron gun 96 which produces a beam of electrons 98 toward the fluorescent screen 94. The electron beam 98 emitted by the electron gun 96 is deflected or swept by a deflection coil 100 within a predetermined angular range in a horizontal plane. The intensity of the beam 98 is controlled by a driver circuit (not shown). The fluorescent screen 94 emits a horizontal scanning line of light when struck by a corresponding horizontal line of the electron beam 98 that represents a line of picture elements. Usually, a multiplicity of such horizontal lines correspond to a certain image or a line of images.

The horizontal line of light emitted by the fluorescent screen 94 is converted by an optical filter 102 into a light having a wavelength band to which a photosensitive paper 104 is sensitive. Then, the light is focused on the photosensitive paper 104, by an optical focusing device 106. The photosensitive paper 104 is fed on a support 108 by feed rollers 110, at a speed corresponding to a rate at which successive lines of light are emitted by the fluorescent screen 94. In this manner, latent images are formed on the photosensitive paper 104. If silver chloride is used for a photosensitive material of the photosensitive paper 104, the exposed paper 104 is fed through a developing device 112 for development of the latent images with a developing liquid. If the photosensitive paper 104 is a light- and pressure-sensitive paper which includes microcapsules made of a radiation-curable resin, the image-wise exposed paper 104 is fed through a pressure nip between pressure rollers 114 as a developing device.

In a commonly used photosensitive paper, the density of images formed on the paper is varied according to an amount of exposure to a radiation, only after the paper is exposed to a predetermined basic minimum amount of radiation. For example, in the case of a silver chloride photosensitive paper, the image density is varied within a range B indicated in FIG. 6. In the case of a light- and pressure-sensitive paper using microcapsules made of a radiation-curable resin, the image density is varied within a range B indicated in FIG. 7. In both cases, the image density is changed after the photosensitive medium is exposed to a certain amount of light exposure, i.e., basic minimum amount E1. Accordingly, the formation of latent images on the photosensitive medium requires the fluorescent screen 94 of the CRT 90 to emit a radiation whose intensity must cover the entirety of the density-variable range B, the lower limit E1 of which is considerably high. In other words, the light source for exposing the recording medium, i.e., the CRT 90, must have a minimum luminance capacity equivalent to the basic minimum light exposure E1. Hence, the light source must have a relatively large capacity, and is relatively less durable in operation.

In the case where the above-indicated image transfer system is adapted to form color images, a color balance of the images may be unfavorably changed due to a difference in sensitivity of three types of microcapsules to respective radiation wavelengths corresponding to the three primary colors of light, and/or a fluctuation in the operating characteristics of the corresponding three light sources due to a variation in line voltage and/or ambient temperature. Accordingly, the conventional color image transfer system must be adjusted for consistency of the color balance before the system is shipped. This adjustment takes considerable time and labor, increasing the cost of the system. The color balance adjustment requires control circuits or devices for changing the intensities of the light sources for the three primary colors of light, and/or the relative lengths of times of irradiation of the three different wavelengths. Such control circuits and devices also push up the cost of the system.

SUMMARY OF THE INVENTION

It is therefore an object of the present invention to provide an image transfer system wherein a photosensitive medium is image-wise exposed, with a light source device which has a reduced capacity and an improved durability.

Another object of the invention is to provide a color image transfer system using a photosensitive medium, which permits easy color balance adjustments.

According to the present invention, there is provided an image transfer system wherein latent images are formed on a photosensitive medium by exposure to a radiation according to image signals, and are developed into visible images, the photosensitive medium having a basic minimum amount of exposure to the radiation, which substantially defines a lower limit of a density-variable range in which a density of the visible images is varied according to an amount of exposure of the photosensitive medium to the radiation, the present image transfer system includes a first device, a second device and a developing device. The first device is adapted to expose the photosensitive medium to the radiation by a predetermined basic amount not larger than the basic minimum amount. The second device is adapted to expose local areas of the photosensitive medium to a controlled intensity of the radiation represented by the image signals, and thereby cooperate with the first device to form the latent images on the photosensitive medium. The latent images formed on the photosensitive medium are developed into the visible images by the developing device.

In the image transfer system of the present invention constructed as described above, the photosensitive medium is exposed by the first device and the second device. Accordingly, the amount of exposure of the photosensitive medium given by the second device is the total amount of exposure of the medium to the radiation, less the predetermined basic amount given by the first device. Therefore, the instant image transfer system requires the second device to produce a relatively reduced amount of radiation, thereby lowering a required luminance of a light source for the second device. Consequently, the latent images can be efficiently formed, with minimum deterioration of the light source, and the durability of the light source is improved.

According to one feature of the present invention, the photosensitive medium contains three different kinds of photosensitive materials which are sensitive to different wavelengths of the radiation corresponding to three primary colors, the first device exposing the photosensitive medium to the different wavelengths by different basic amounts.

Preferably, the photosensitive medium used in the present image transfer system consists of a substrate, a developer layer formed on the substrate, and a multiplicity of microcapsules formed on or embedded in the developer layer. Each microcapsule includes: a photosensitive resin which is curable by polymerization upon exposure to light; a colorless chromogenic material (color former) which reacts with the developer layer to form a visible image spot; and a photoinitiator for promoting the polymerization of the chromogenic material. The microcapsule may be covered with a suitable outer coating. Upon exposure to a radiation from the second device, the photosensitive resin of the microcapsules in the exposed areas of the photosensitive medium is polymerized and is thus cured, while the photosensitive resin of the microcapsules in the unexposed areas remains uncured. The latent images on the photosensitive medium are developed into the visible image by the developing device, which is adapted to rupture the uncured microcapsules by applying a pressure, friction or heat. That is, when the uncured microcapsules are ruptured by the developing device, the chromogenic materials come out of the ruptured microcapsules and react with the developer layer, producing the visible image spots or dots on the photosensitive medium. This type of photosensitive medium is referred to as "self-activated type". In the case where the radiation-curable resin of the photosensitive medium is cured upon exposure to light, the images represented by the image signals are reversed with respect to the visible images developed on the photosensitive medium. However, if the photosensitive medium has microcapsules whose base resin is softened or becomes brittle upon exposure to light, the visible images formed on the photosensitive medium are not reversed to the images represented by the image signals. In the latter case, the photosensitive resin of the microcapsules may consist of 3-oximino-2-butanone methacrylate which undergoes main chain scission upon light exposure, or poly 4'-alkyl acylo-phenones.

The color of the visible images formed on the photosensitive medium is determined by the chromogenic material contained in the microcapsules, and is not directly affected by the wavelength of the radiation to which the photosensitive resin of the microcapsules is sensitive. Hence, the color of the visible images is generally different from that of the corresponding images displayed on a cathode ray tube, for example, which is used as the second device. Where the second device consists of a cathode ray tube, the tube is adapted to emit a radiation in the non-visible spectra.

According to another feature of the present invention, the photosensitive medium contains three different photosensitive materials which are sensitive to different radiation wavelengths corresponding to three primary colors. In this case, the first device is adapted to expose the photosensitive medium to the different wavelengths by different basic amounts.

In one form of the above feature of the invention, the first device includes a single light source, and a filter device including three filters operable for converting the radiation from the single light source into three rays of light having the different wavelengths. This arrangement is used with a photosensitive medium for color imaging. The three filters, which are adapted to the three primary colors of the visible images, make it possible to establish a desired color balance of the visible images on the photosensitive medium.

According to a further feature of the invention, the first device is adapted to expose the medium either before or after the second device exposes the medium.

According to a still further feature of the invention, the second device comprises a chathode ray tube operable to successively emit lines of light representative of corresponding lines of picture elements according to the image signals, and an optical focusing device disposed between the cathode ray tube and the photosensitive medium, for focusing the lines of light on the photosensitive medium.

According to another aspect of the present invention, there is provided an image transfer system wherein visible images are formed on a photosensitive medium according to image signals, comprising: (a) a light source in the form of a bar for emitting a line of light; (b) a waveguide for directing the line of light toward the photosensitive medium; (c) a rotary filter device having a plurality of filter elements which are selectively brought into alignment with the waveguide by rotation of the rotary filter device about an axis thereof parallel to the light source, the three filter elements permitting components of the line of light having specific wavelengths, to pass therethrough and through the waveguide, the filter elements extending parallel to the axis of rotation of the filter device; and (d) an optical switch array having a plurality of optical switches which are selectively opened according to the image signals, so as to permit the components of the light from the waveguide to pass through the selectively opened optical switches to expose corresponding areas of the photosensitive medium.

The image transfer system according to the above aspect of the invention is suitably used for color imaging. In this case, the filter elements correspond to three primary colors of light, and are selectively aligned with the waveguide by rotating the filter device about its axis. According to this arrangement, a difference in sensitivity of the photosensitive medium to the different radiation wavelengths corresponding to the three primary colors, and/or a fluctuation in the operating characteristics of the light source, can be compensated for by adjusting the surface areas of the individual filter elements, and/or the speeds at which the filter elements are moved past the waveguide (by controlling the rotating speed of the rotary filter device for each filter element). Thus, the instant image transfer system using the single light source is capable of easily establishing a desired color balance of the color images, with the rotary filter device which is relatively simple in construction.

According to one feature of the above aspect of the invention, each of the filter elements has a generally rectangular stationary shield fixed thereto for interrupting the line of light from the light source. The shield extends parallel to the axis of rotation of the rotary filter device and has a width smaller than the each filter element.

In one form of the above feature of the invention, the stationary shield overlaps a portion of the each filter element as seen in a direction of rotation of the filter device.

In accordance with another form of the same feature of the invention, each filter element further has a generally rectangular movable shield which extends parallel to the axis of rotation of the rotary filter device and has a smaller width than the each filter element in the direction of rotation. The movable shield is supported movably relative to the corresponding filter element in a direction of rotation of the filter device, so as to overlap a portion of the each filter element for interrupting the line of light from the light source.

According to a further feature of the above aspect of the invention, each of the filter elements is inclined a predetermined angle relative to the line of light from the light source when the each filter is aligned with the waveguide. The filter element has a substantially parallelogrammic shape as seen in a direction of propagation of the line of light through the waveguide.

BRIEF DESCRIPTION OF THE DRAWINGS

The above and other objects, features and advantages of the present invention will become more apparent by reading the following detailed description of some preferred embodiments of the invention, when considered in connection with the accompanying drawings, in which:

FIG. 3 is a schematic view corresponding to that of FIG. 1, illustrating another embodiment of the image transfer system of the invention;

DETAILED DESCRIPTION OF THE PREFERRED EMBODIMENTS

To further clarify the concept of the present invention, some preferred embodiments of the invention will be described in detail, by reference to the accompanying drawings.

Figure 1:
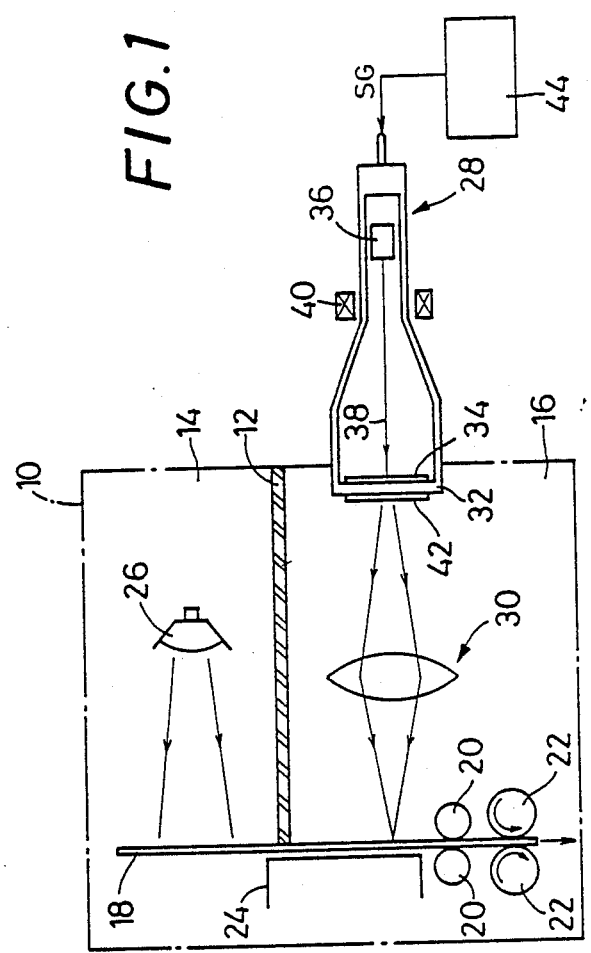
FIG. 1 is a schematic view of one embodiment of an image transfer system of the present invention.

Referring first to FIG. 1, reference numeral 10 designates a frame of an image transfer system. The frame 10 is divided by a partition wall 12 into a first darkroom 14 and a second darkroom 16. Within the frame 10, there is provided a paper path along which a photosensitive paper 18 is advanced by means of feed rollers 20. Downstream of the feed rollers 20, there are disposed developing pressure rollers 22 which will be described. The photosensitive paper 18 is fed from a storage tray (now shown) and moved on a support 24 in a direction from the first darkroom 14 toward the second darkroom 16. The processed paper 18 is finally discharged out of the frame 10. As described later in greater detail, the photosensitive paper 18 is image-wise exposed while being fed through the darkrooms 14, 16. The exposed paper 18 is further fed through a pressure nip between the pressure rollers 22, under a predetermined squeezing surface pressure. The photosensitive paper 18 used in the present embodiment has a layer of microcapsules containing a chromogenic or photosensitive composition. The microcapsules are selectively ruptured during a pass of the photosensitive paper 18 through the pressure nip of the rollers 22, whereby images are formed at selected local areas on the paper 18, as discussed below. In the present embodiment, therefore, the pressure rollers 22 serve as a developing device.

Figure 2:
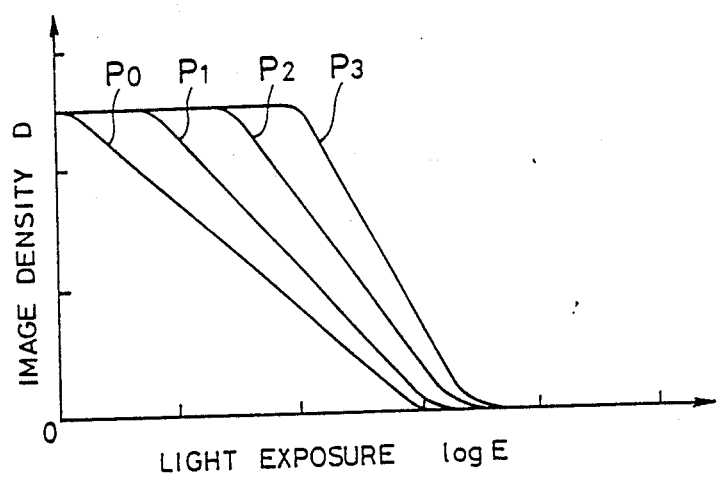
FIG. 2 is a graphical representation showing a relationship between an amount of light exposure of a photosensitive paper and a density of images developed on the paper with different developing pressures.
Figure 7:
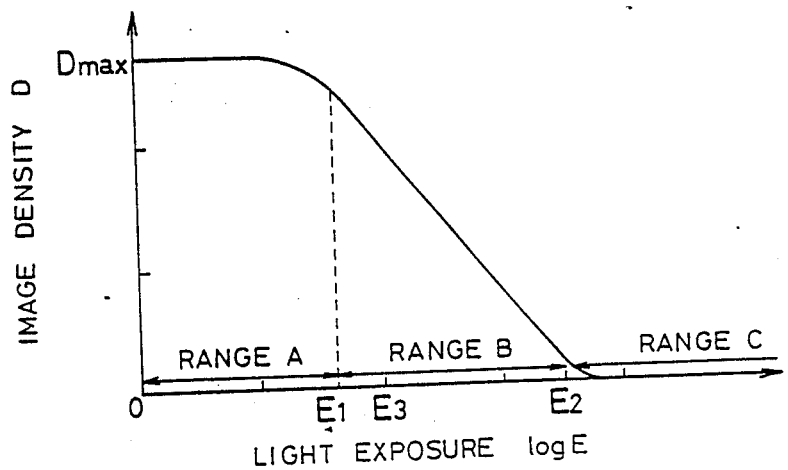
FIG. 7 is a graph showing an exposure-density relationship where a photosensitive paper using radiation-curable resin microcapsules is used.

The photosensitive paper 18 is used in the present system as a photosensitive recording medium. An example of this type of recording medium is disclosed, for example, in Laid-Open Publications 58-23024 and 58-23025 (laid open in 1983) of Japanese Patent Applications. More specifically, the photosensitive paper 18 consists of a substrate, a developer layer formed on the substrate, and a layer of microcapsules formed on the developer layer. Each microcapsule includes a photosensitive resin which is curable upon exposure to a radiation, and a colorless chromogenic material or color former which reacts with the developer layer to form a visible image. Upon exposure to a radiation, the photosensitive resin of the microcapsules in exposed areas of the photosensitive paper is polymerized and thus cured, while the photosensitive resin of the microcapsules in unexposed areas remains uncured. The cured microcapsules in the exposed areas are not ruptured in a developing process, that is, while the photosensitive paper 18 is fed through the nip of the developing pressure rollers 22. However, the insufficiently cured or partially cured microcapsules are ruptured to a varying degree depending upon the extent to which the microcapsules are exposed. As a result, the colorless chromogenic material is transferred to the developer layer and reacts with a developer material of the developer layer. Since the amount of the chromogenic material reacting with the developer material is commensurate with the amount or degree of light exposure of the microcapsules (and the degree of rupture), the density of the formed image is proportional to the amount of light exposure of the corresponding microcapsule. As illustrated in FIG. 7, the image density is maximum or almost saturated within an exposure range A whose upper limit E1 defines a basic minimum amount of light exposure of the photosensitive paper 18 to form a visible image. The density (log E) decreases as the light exposure increases within an intermediate range B defined by lower and upper limits E1 and E2. The image density is almost zero in a range C wherein the light exposure exceeds a certain limit, i.e., upper limit of the range B. Thus, the light exposure is varied within the range B, in order to produce images of a varying density. The range A is determined by the polymerization property of the radiation-curable resin which forms the base of each microcapsule, and by the preset nip pressure of the pressure rollers 22. Described in more detail, the microcapsule 30 includes a photosensitive composition encapsulated in the radiation-curable resin. The photosensitive composition includes the previously indicated chromogenic material, and a photoinitiator. Upon exposure to a radiation, the photoinitiator is decomposed to free radicals, whereby the base resin is polymerized and solidified. However, in an initial stage of exposure, oxygen present in the microcapsule reacts with the free radicals, retarding the initiation of the polymerization of the base resin. Further, the density-exposure characteristics of the photosensitive paper 18 differs depending upon a developing pressure, as indicated in FIG. 2. The developing pressure for stable development of images is preferably held within a range between P1 and P2 (for example, about 20–30 kg/cm$^2$). In the figure, the developing pressures (nip pressures of the pressure rollers 22) Po, P1, P2 and P3 increase in the order of description.

Referring back to FIG. 1, a basic or first exposure device in the form of an illuminating lamp 26 is disposed in the first darkroom 14. A radiation emitted by this lamp 26 includes rays of light having a wavelength to which the photosensitive paper 18 is sensitive. While the photosensitive paper 18 is fed through the first darkroom 14, the paper 18 is exposed to such rays of light, to obtain a preliminary exposure equal to the basic minimum amount E1, i.e., the lower limit of the density-variable range B, as indicated in FIG. 7. The luminance capacity of the lamp 26 is so determined as to obtain this basic minimum exposure E1.

In the second darkroom 16, there is provided a monochrome image-forming or second exposure device which includes a cathode ray tube (CRT) 28 and a focusing device (optical system) 30. The CRT 28, which functions as a light source for forming latent images on the photosensitive paper 18, has a faceplate 32, a fluorescent screen 34 disposed inside the faceplate 32, and an electron gun 36 which emits an electron beam 38 toward the fluorescent screen 34. The CRT 28 is provided with a deflection coil 40 for sweeping or deflecting the electron beam 38 over a predetermined angular range, in a plane perpendicular to the direction of feed of the photosensitive paper 18. The intensity of the electron beam 38 is regulated by a suitable driver circuit (not shown), according to an IMAGE signal SG generated by an image-signal generator 44. The fluorescent screen 34 emits a line of light when swept by the corresponding electron beam 38 from the electron gun 36. The emitted line of light from the fluorescent screen 34, which represents a line of picture elements, is passed through an optical filter 42, whereby only the rays of light in a spectrum corresponding to a sensitive range of the photosensitive paper 18 is incident upon the focusing device 30, and is thus focused on the photosensitive paper 18. The photosensitive paper 18 is fed by the feed rollers 20 on the support 24, at a speed corresponding to a rate at which successive lines of light are emitted by the fluorescent screen 34. In this manner, latent images are formed on the photosensitive paper 18, by repetitive scanning of the image-signal light from the fluorescent screen 34, in the direction perpendicular to the feed direction of the paper 18. The thus image-wise exposed photosensitive paper 18 is passed through a pressure nip between the pressure rollers 22, whereby the latent images are developed into visible images.

As described above, the present embodiment is adapted such that the photosensitive paper 18 is subjected to a preliminary exposure in the first darkroom 14 by the basic exposure device (lamp 26), to obtain the basic minimum exposure E1, and is then subjected to an image-forming exposure in the second darkroom 16 by the image-forming exposure device 28, 30, whereby latent images are formed on the photosensitive paper 18. Therefore, the amount of light that must be generated by the fluorescent screen 34 is only a difference between the total amount of light received by the photosensitive paper 18 for the formation of latent images, and the basic minimum amount E1 obtained during the preliminary exposure by the lamp 26. Consequently, the required intensity of the light emitted by the fluorescent screen 34 can be accordingly reduced. Thus, the instant image transfer system permits efficient formation of latent images on the photosensitive paper 18, with reduced deterioration and improved durability of the fluorescent screen 34.

Further, the instant arrangement permits a comparatively large relative variation in the level of the IMAGE signals SG which are applied to the CRT 28 to designate different densities of the corresponding images. In other words, the instant image transfer system permits a comparatively high ratio of one IMAGE signal level to another, with the lowest level corresponding to the basic minimum exposure E1 of FIG. 7, thus facilitating calibration of the image density.

Referring next to FIG. 3, another embodiment of the invention will be described. In the interest of brevity and simplification, the same reference numerals as used in FIG. 1 are used in FIG. 3 to identify the functionally corresponding components.

Figure 4:
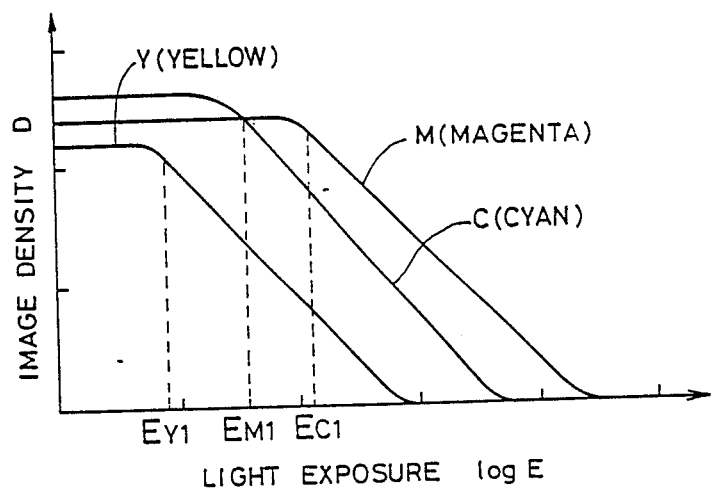
FIG. 4 is a graphical representation illustrating an exposure-density relationship in color image development, in the embodiment of FIG. 3.
Figure 5:
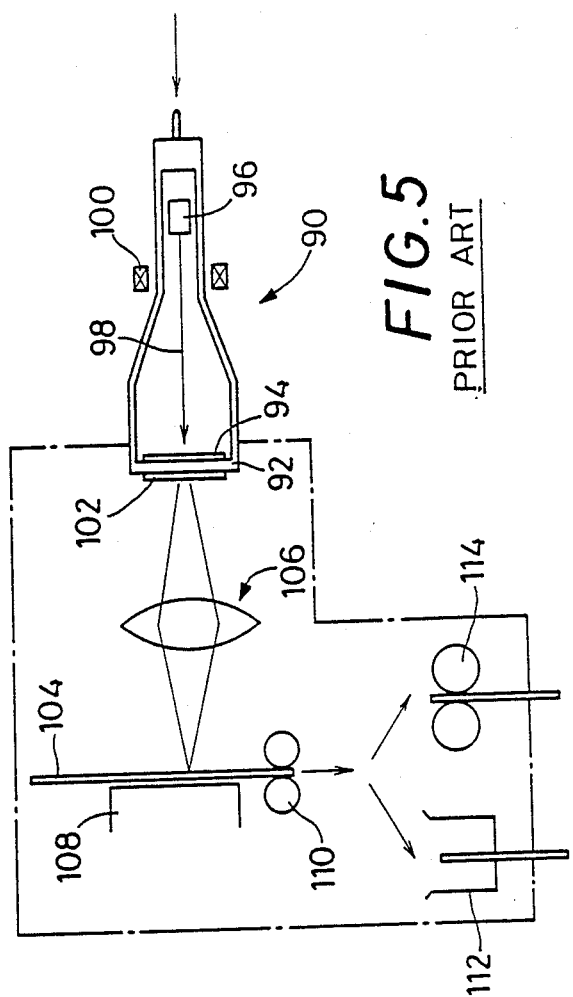
FIG. 5 is a schematic view showing a known image transfer system.
Figure 6:
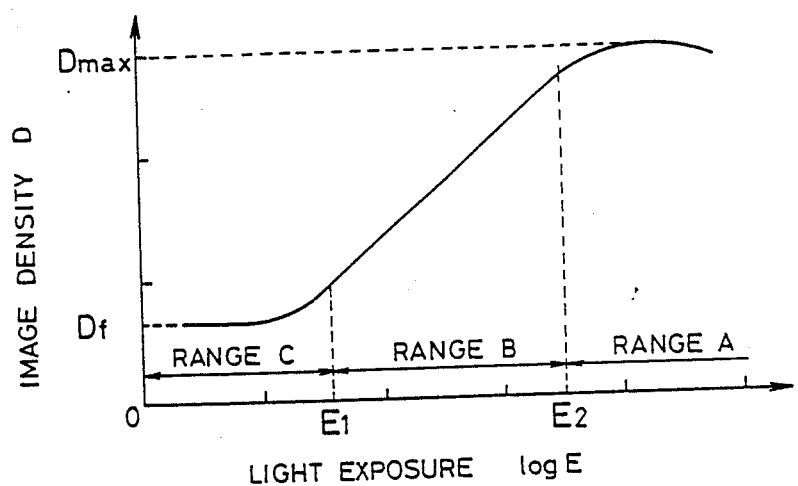
FIG. 6 is a graph showing an exposure-density relationship where a silver chloride photosensitive paper is used.

This modified embodiment uses a photosensitive paper 48 capable of forming color images thereon. This photosensitive paper 48 has three types of microcapsules distributed in a mixed condition, for example, microcapsules C curable by a radiation having a wavelength λC of about 340 nm, microcapsules M curable by a radiation having a wavelength λM of about 385 nm, and microcapsules Y curable by a radiation having a wavelength λY of about 470 nm. Each of the microcapsules C contains a normally colorless chromogenic material which produces a cyan color. Similarly, the microcapsules M and Y contain normally colorless chromogenic materials which produce magenta and yellow colors, respectively. Accordingly, when the photosensitive paper 48 is locally exposed to the radiation having the wavelength λC, only the microcapsules C in the exposed area are cured, and the microcapsules M and Y in that exposed area are ruptured to produce the magenta and yellow colors in the developing process, whereby a reddish color is produced. Similarly, the microcapsules M in an area of the photosensitive paper 48 exposed to the radiation having the wavelength λM are cured, and the microcapsules C and Y in that area are ruptured to produce the cyan and yellow colors in the developing process, whereby a greenish color is produced. Likewise, the microcapsules Y are cured, and the microcapsules C and M are ruptured to produce the cyan and magenta colors, eventually creating a blueish color, when these microcapsules are exposed to the radiation having the wavelength λY. FIG. 4 shows density-exposure relationships for the three types of microcapsules C, M and Y.

In the first darkroom 14, there are disposed three illuminating lamps 50C, 50M and 50Y. The lamp 50C emits a radiation of the wavelength C, and the luminance of this lamp 50C is determined so that the photosensitive paper 48 passing through the first darkroom 14 is exposed to the radiation by a basic minimum amount EC1 as indicated in FIG. 4. The lamp 50M emits a radiation of the wavelength λM, and the luminance of this lamp 50M is determined so that the paper 48 is exposed to the radiation by a basic minimum amount EM1 as also indicated in FIG. 4, while the paper 48 is fed through the first darkroom 14. Similarly, the lamp 50Y emits a radiation of the wavelength λY, and the luminance of the lamp 50Y is determined so as to expose the paper 48 to the radiation by a basic minimum amount EY1 as indicated in FIG. 4, during passage of the paper 48 through the first darkroom 14.

While the three lamps 50C, 50M and 50Y are provided in the present embodiment, these lamps may be replaced by a single lamp which is adapted to emit radiations having the three different wavelengths λC, λM and λY, so that the amounts of these three radiations are proportional to the basic minimum amounts EC1, EM1 and EY1 as indicated in FIG. 4. This arrangement eliminates adjustment of the radiation wavelength for each of the three lamps, and reduces the size and cost of the image transfer system.

In the second darkroom 16, there is provided a color-imaging CRT 52. On the inside surface of the faceplate 32 of this CRT 52, there are disposed three fluorescent elements 54R, 54G and 54B. The element 54R emits a line of light corresponding to red picture elements of an image, and the element 54G emits a line of light corresponding to green picture elements of the image. Similarly, the element 54B emits a line of light corresponding to blue picture elements of the image. These lines of light are produced when the respective fluorescent elements 54R, 54G and 54B are struck by electron beams 38 which are produced by the electron gun 36. More specifically, the electron gun 36 is driven by the IMAGE signals SG generated by the image-signal generator 44. The electron beams 38 are deflected by the deflection coil 40 over a predetermined angular range, and the intensity of the beams is adjusted by the driver circuit (not shown). Accordingly, successive lines of light representing red picture elements of the corresponding lines of images to be formed on the photosensitive paper 48 are produced by the fluorescent element 54R, according to the IMAGE signals SG from the image-signal generator 44. Similarly, successive lines of light representing green picture elements of the corresponding lines of images are produced from the fluorescent element 54G, while successive lines of light repreenting blue picture elements of the corresponding lines of images are produced from the fluorescent element 54B.

On the front surface of the faceplate 32, there are disposed three optical filters 56C, 56M and 56Y for converting the lights from the respective fluorescent elements 54R, 54G and 54B into corresponding radiations which have wavelengths λC, λM and λY, respectively, to which the three types of the microcapsules C, M and Y are sensitive. These radiations are then focused on the photosensitive paper 48 by the optical focusing device 30. The photosensitive paper 48 are exposed to the radiations from the fluorescent elements 54R, 54G and 54B through the filters 54C, 54M and 54Y, while the paper 48 is fed on the support 24, at a speed corresponding to a rate at which the fluorescent elements are swept by the electron beams 38. Thus, latent images are formed on the photosensitive paper 48, and are developed into visible color images while the paper 48 is passed through the nip of the pressure rollers 22.

In the present embodiment, too, the photosensitive paper 48 is subjected to a preliminary exposure in the first darkroom 14 by the basic exposure lamps 50C, 50M and 50Y, by the basic minimum amounts EC1, EM1 and EY1 as indicated in FIG. 4. Subsequently, the photosensitive paper 48 is subjected to an image-forming exposure in the second darkroom 16, by the image-forming exposure device 52, 30, whereby the latent images are formed. Therefore, the required luminance of each fluorescent element 54R, 54G and 54B of the CRT 52 is equal to the total amount of exposure of the photosensitive paper 48, less the basic minimum amount EC1, EM1, EY1 provided by the respective basic exposure lamps 50C, 50M and 50Y. Accordingly, the image transfer may be efficiently achieved with comparatively reduced levels of luminance of the fluorescent elements 54R, 54G and 54B. This results in reduced deterioration and improved life expectancy of the elements 54R, 54G and 54B.

Further, since the microcapsules C, M and Y are subjected to preliminary exposures by the different basic minimum amounts EC1, EM1 and EY1, there is no need of adjusting the levels of the IMAGE signals SG for the cyan, magenta and yellow colors, for compensating for the differences in the basic minimum exposure amounts. That is, the amounts of image-forming exposures by the image-forming exposure device 52, 30 are varied within substantially the same ranges, to obtain the same density-exposure relationships for the three types of microcapsules C, M and Y.

Although the photosensitive paper 18, 48 of the type using radiation-curable microcapsules are used in the above-illustrated embodiments of FIGS. 1 and 3, other types of photosensitive paper such as a silver chloride coated paper may be used as a photosensitive recording medium.

In the above embodiments, the luminance of the basic exposure lamp 26, for example, is determined so as to give the basic minimum exposure E1 to the photosensitive paper 18, a preliminary exposure amount given by the basic exposure device may be smaller than the basic minimum amount E1 which is the lower limit of a range (indicated at B in FIG. 7) in which the density of images is varied according to the amount of the image-forming exposure by the image-forming exposure device 28, 30.

Further, the lower limit of the density-variable range B may be selected at E3 as indicated in FIG. 7, rather than the basic minimum level E1. In this case, the image-forming exposure amount is varied over a range between E3 and E2, and the preliminary exposure given by the basic exposure device (26; 50C, 50M and 50B) is increased to the level of E3.

The image-forming light source may consist of a light source, and a shutter which is opened and closed according to suitable image signals. The image-forming exposure device may be adapted such that its light source is moved relative to the photosensitive paper.

Figure 8:
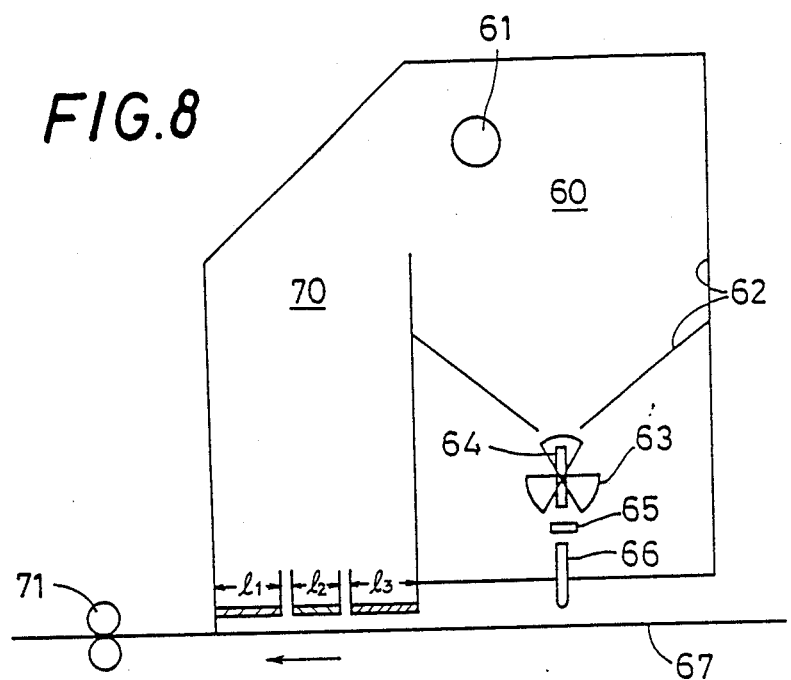
FIG. 8 is a schematic view of a further embodiment of the present invention.

Referring further to FIG. 8, there is shown a further embodiment of the invention, wherein an image transfer system has an image-forming exposure section 60 (indicated on the right-hand side of the figure), and a basic exposure section 70 (indicated on the left-hand side). The image transfer system further has a light source 61 in the form of a bar (such as a fluorescent lamp or FOT) above the image-forming and basic exposure sections 60, 70. The image-forming section 60 includes reflectors 62, a rotary filter device 63, a waveguide 64, an optical switch array 65 disposed parallel to the bar-like light source 61, and a selfoc lens array 66 (graded index type lens) also disposed parallel to the bar-like light source 61. A radiation emitted by the light source 61 is directed to the rotary filter device 63 through the reflectors 62 and other optical elements, and is guided through the waveguide 64 so that the radiation is incident upon the optical switch array 65 and the selfoc lens array 66. The radiation is then incident upon a color-imaging photosensitive paper 67 similar to the photosensitive paper 48 (which has been described in connection with the preceding embodiment). The radiation emitted with a suitable intensity by the light source 61 includes wavelengths corresponding to the three primary colors of light, red, green and blue. These wavelengths are selected by filter elements of the rotary filter device 63 which is rotatable around the waveguide 64. The selected rays of light passing through the respective filter elements are incident upon the optical switch array 65 which consists of a multiplicity of optical switches corresponding to picture elements or dots. The optical switches are selectively activated on to pass the light, according to suitable image signals, so that latent images corresponding to the activated optical switches are formed on the photosensitive paper 67.

Figure 9:
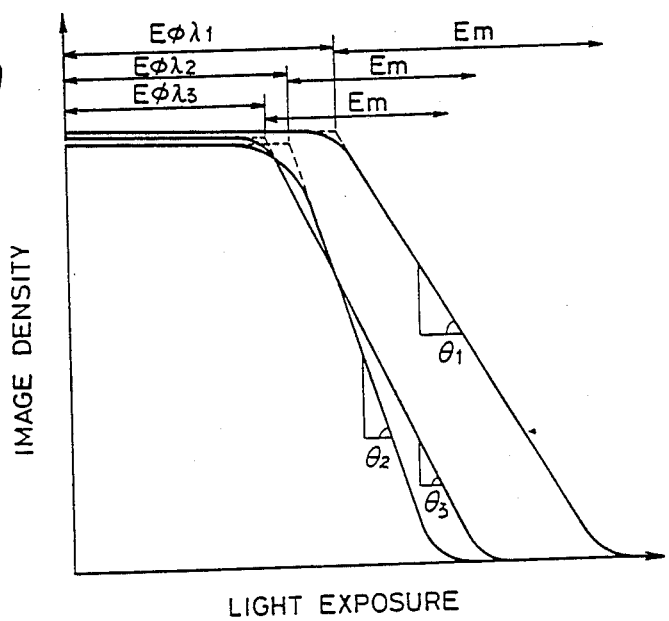
FIG. 9 is a graph showing exposure-density relationships of a color-imaging photosensitive paper, for three different radiations.
Figure 10:
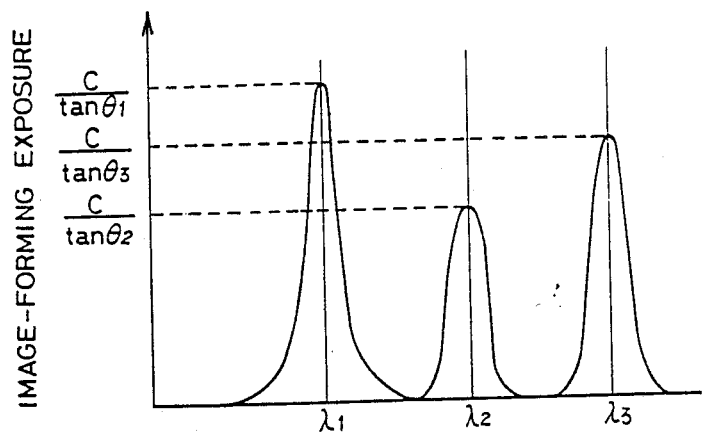
FIG. 10 is an illustration indicating required image-forming exposure amounts for different wavelengths.

FIG. 9 shows density-exposure relationships of the photosensitive paper 67. Basic minimum amounts of exposure of the paper 67 to the radiation wavelengths $\lambda 1$, $\lambda 2$ and $\lambda 3$ to form images are indicated at $E\phi\lambda 1$, $E\phi\lambda 2$ and $E\phi\lambda 3$, which correspond to EC1, EM1 and EY1 of FIG. 4. These basic exposures are given in the basic exposure section 70. Image-forming exposure amounts given in the image-forming exposure section 60 are indicated at Em in FIG. 9. In the present embodiment, the basic exposure of the photosensitive paper 67 for each wavelength is effected after the corresponding image-forming exposure. This basic exposure facilitates the image-forming exposure as already discussed in connection with the preceding embodiments.

The rotary filter device 63 in the image-forming section 60 is adapted such that the image-forming exposure amounts for the wavelengths $\lambda 1$, $\lambda 2$, and $\lambda 3$ are proportional to $C/\tan\theta 1$, $C/\tan\theta 2$ and $C/\tan\theta 3$, respectively, where C represents a constant. As shown in FIG. 8, the basic exposure section 70 has three basic exposure filters l1, l2 and l3, whose effective filter areas are determined in proportion to the basic minimum exposure amounts $E\phi\lambda 1$, $E\phi\lambda 2$ and $E\phi\lambda 3$, respectively. These filter arrangements of the image-forming and basic exposure sections 60, 70 allow balanced suitable exposures of the photosensitive paper 67 to the different wavelengths, even though the intensity of the radiation emitted by the light source 61 is the same for each wavelength, i.e., even though a single light source 61 is used.

Figure 11:
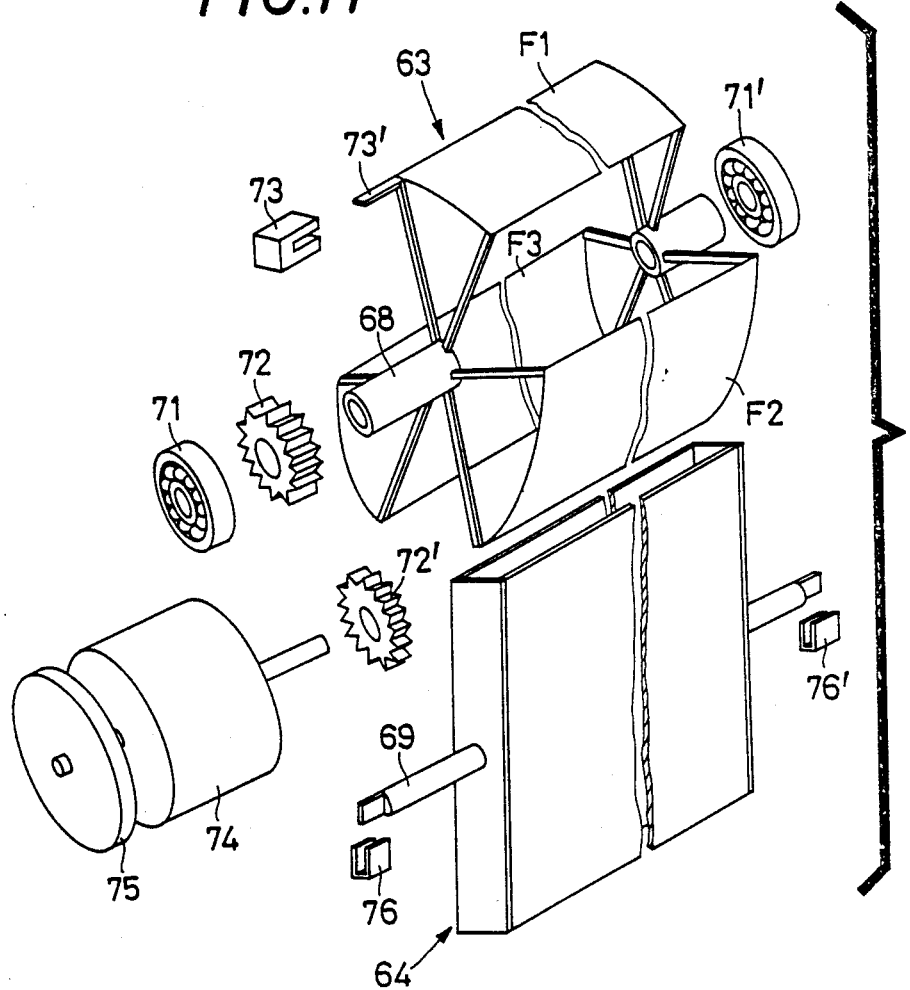
FIG. 11 is an exploded perspective view showing in detail a rotary filter device of an image-forming exposure device of the embodiment of FIG. 8.

Referring next to FIG. 11, the construction of the image-forming device in the section 60 will be described in detail. While the waveguide 64 is shown below the rotary filter device 63 in the figure, the waveguide 64 is disposed in the filter device 63 (as indicated in FIG. 8) such that the filter device 63 is rotatable around the waveguide 64.

The rotary filter device 63 is rotatably supported by bearings 71, 71', and is rotated by a motor 74 via gears 72, 72', about its hollow shaft 68. The waveguide 64 has a shaft 69 which extends through the hollow shaft 68 of the rotary filter device 63. The shaft 69 is fixed by fixing members 76, 76' outside the filter device 63.

Figure 12:
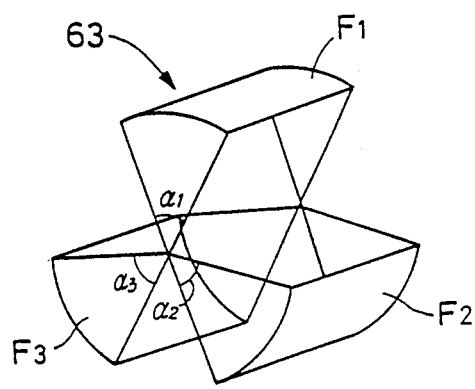
FIG. 12 is a perspective view indicating center angles of the rotary filter device which correspond to surface areas of three filter elements.

The rotary filter device 63 has three filter elements F1, F2 and F3 corresponding to the three primary colors of light. The filter elements F1, F2 and F3 are spaced apart from each other in a rotating direction of the rotary filter device 63, as illustrated in FIG. 12. Suitable spaces are provided between the adjacent filter elements F1, F2, F3. The surface areas of the filter elements F1, F2 and F3, and center angles $\alpha 1$, $\alpha 2$ and $\alpha 3$ (FIG. 12) defining the arcs of the filter elements, are determined in proportion to $C/\tan\theta 1$, $C/\tan\theta 2$ and $C/\tan\theta 3$ as previously suggested. This arrangement permits intended image-forming exposures of the photosensitive paper 67 to the wavelengths corresponding to the three primary colors of light, while compensating for a difference in the sensitivity of the photosensitive paper 67 to those different wavelengths, and/or a fluctuation of the light source 61 in its intensity for each radiation wavelength. The rays of light which have passed through the filter elements F1, F2 and F3 are incident upon the optical switch array 65 (FIG. 8) which is opened in synchronization with the passage of the light through the filter device 63. The waveguide 64 may be replaced by optical fibers, selfoc lens or other alternatives. In the present rotary filter device 63, the filter elements F1, F2 and F3 are arcuate in shape. However, these elements may consist of an arcuate portion and a flat portion. In this case, too, the filter elements are adapted to receive a line of light produced by the bar-like light source 61. While the rotary filter device 63 has a generally hexagonal shape defined by the three filter elements F1, F2 and F3 and the adjacent three spaces, the device 63 may have other polygonal shapes having N sides (N: integer), so that one of the three filter elements F1, F2 and F3 is selectively brought into alignment with the inlet of the waveguide 64, during rotation of the device 63. In either case, the filter elements F1, F2 and F3 need not be separated from each other by adjacent spaces, provided each filter element and the corresponding space can be aligned with the upper and lower ends of the waveguide 64. It is preferred that the filter elements F1, F2 and F3 are separated from each other by suitable transparent members whose weights are adjusted to establish a balance of the rotary filter device 63 as a whole.

The operation of the rotary filter device 63 is controlled by an electronic control circuit which incorporates an index switch 73, 73', and a rotation sensor 75 for sensing the rotating speed of the drive motor 74. This aspect will be described referring to FIG. 13. The image-forming exposure amounts of the photosensitive paper 67 can be adjusted by regulating the speeds at which the filter elements F1, F2 and F3 are moved along the circular path of the device 63. It is considered possible to control the amounts of light passing through the filter elements, by adjusting the thickness and density of the individual filter elements, in addition to the surface area and speed of the filter elements. The same adjustments may apply to the basic exposure filters 11, 12 and 13.

According to the present embodiment, a variation of the light source 61 in the intensity of the different radiation wavelengths, and a difference of sensitivity of the photosensitive paper 67 to the different wavelengths, can be compensated for by adjusting the surface areas of the filter elements F1, F2 and F3, and the center angle $\alpha 1$, $\alpha 2$ and $\alpha 3$ formed around the shaft 68. Thus, the developed photosensitive paper 67 can be given a desired color balance. Further, the relatively simple rotary filter device 63 makes it possible to easily produce a desired color balance adjustment, even with the bar-like light source 61.

The light source 61 may be adapted such that the intensity of light of each wavelength (corresponding to each of the three primary colors of light) is adjusted, while a still remaining difference is compensated for by the adjustments of the filter elements F1, F2 and F3. Alternatively, the adjustment of the center angles $\alpha 1$, $\alpha 2$ and $\alpha 3$ of the filter device 63 is achieved as a primary compensation, and the thickness and other parameters of the filter elements F1, F2 and F3 are adjusted as an auxiliary compensation.

Figure 13:
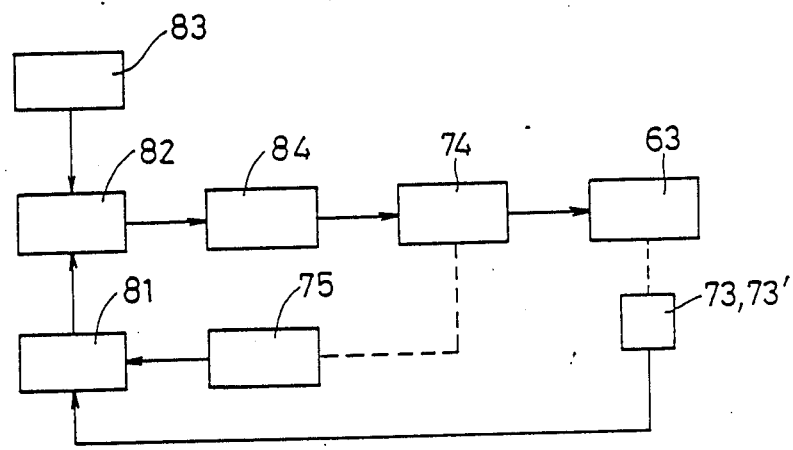
FIG. 13 is a block diagram of a driver circuit for controlling a motor for activating the rotary filter device.

In the case where the adjustment of the image-forming exposure amount for each wavelength is effected by controlling the time in which the filter elements F1, F2 and F3 pass the inlet of the waveguide 64, the position and speed of the filter elements are detected by the index switch 73, 73' and the rotation sensor 75. As illustrated in FIG. 13, the position and speed signals from the index switch 73, 73' and the rotation sensor 75 are received by a position/speed detector circuit 81. In the meantime, speed data indicative of the speed of each filter element is generated from a speed data circuit 83. The outputs of the position/speed circuit 81 and the speed data circuit 83 are applied to an arithmetic circuit 82, whose output is applied to a driver circuit 84 to activate the motor 74, so that each filter element F1, F2 and F3 is moved at a speed represented by the speed data from the speed data circuit 83.

Figure 14:
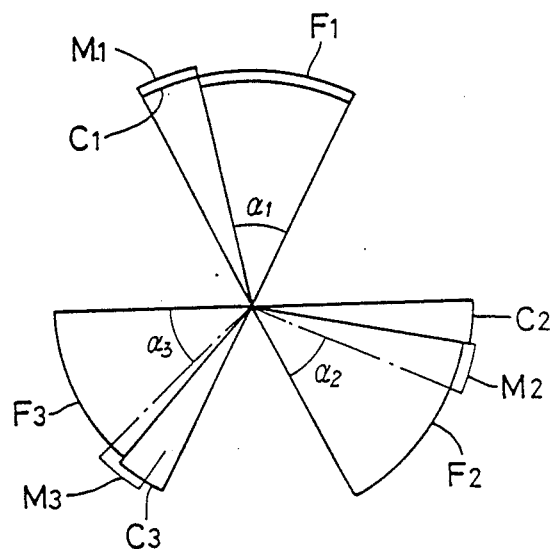
FIG. 14 is a view showing a rotary filter device equipped with stationary and movable shields.

A modified form of the rotary filter device is depicted in FIG. 14, wherein elongate substantially rectangular stationary shields C1, C2 and C3 are fixedly disposed at the leading end of the respective filter elements F1, F2 and F3 (as seen in the rotating direction of the filter device). The shields C1, C2 and C3 extend parallel to the axis of the filter device, so as to overlap the corresponding leading portions of the filter elements F1, F2 and F3. Further, substantially rectangular movable shields M1, M2 and M3 are disposed radially outwardly of the stationary shields C1, C2 and C3, such that these movable shields are movable along the arcs of the filter elements F1, F2 and F3, in the direction of rotation of the filter device 63. The movable shields M1, M2 and M3 can be fixed at desired positions on the filter elements. In this arrangement, the effective surface areas of the filter elements F1, F2 and F3 can be suitably adjusted by positioning the movable shields M1, M2 and M3 relative to the filter elements, so that the suitable portions of the filter elements are covered by the movable shields. Further, the present arrangement permits compensation for a variation in the ON-OFF times of the optical switch array 65, and is effective to improving the control accuracy of the image-forming exposures. The stationary and movable shields C1, C2, C3, M1, M2 and M3 may be disposed near the trailing end of the filter elements F1, F2 and F3. Alternatively, it is possible that one of the stationary and movable shields on each filter element is disposed near the leading end, while the other shield is disposed near the trailing end. Further, these shields may be disposed on the inner surfaces of the filter elements.

The stationary shields C1, C2 and C3 need not be flat, and may be filter sheets whose leading portions extend from respective rolls to cover portions of the filter elements. In this case, the filter sheets may be used as movable shields, by adjusting the length of extension from the rolls.

The rotary filter device 63 need not be rotated in one predetermined direction. Further, the rotary filter may be replaced by a pivotal filter which is pivoted bisectionally. In any case, the filter device must have a plurality of filter elements which are moved as a unit.

Figure 15:
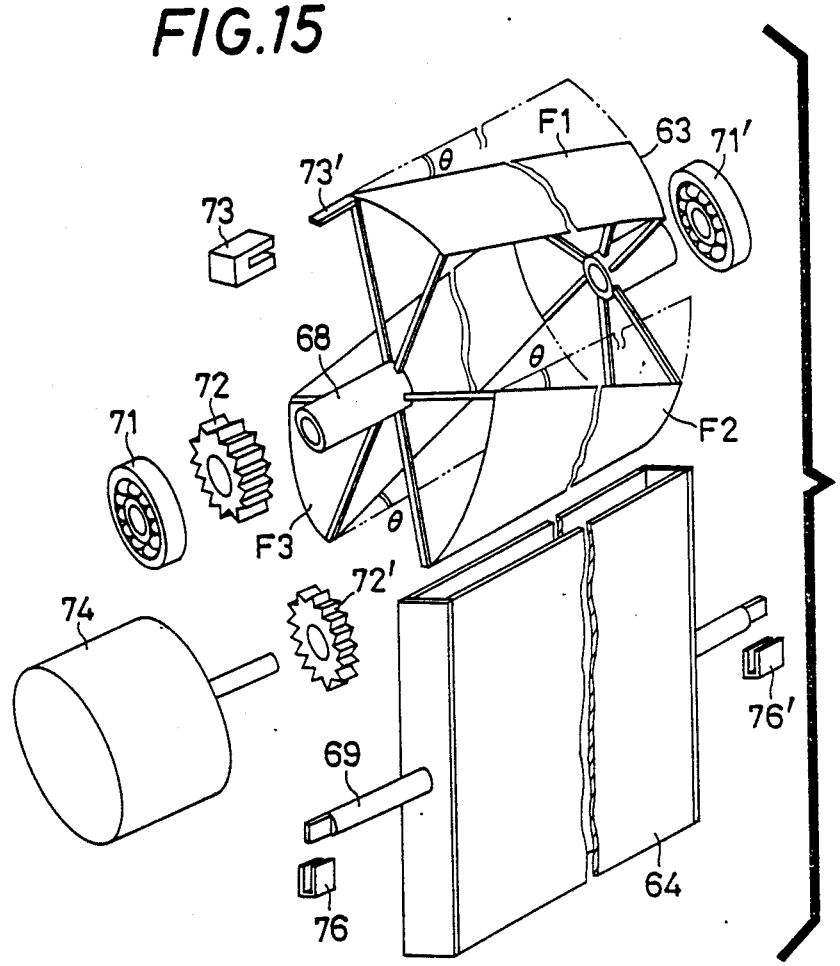
FIG. 15 is an exploded perspective view of a modified rotary filter adapted for increased rotating speed.

The optical switches of the optical switch array 65 extending along the bar-like light source 61 are difficult to be activated at one time. Usually, therefore, the optical switches or groups of the optical switches are sequentially activated, from one end of the array 65 toward the other end. Consequently, the completion of activation of all optical switches requires a given time corresponding to a given angle of rotation of the rotary filter device 63. This does not cause a problem where the rotating speed of the filter device 63 is low. But, where the filter device 63 is rotated at a relatively high speed, the activation of some of the optical switches is delayed with respect to the passage of the filter elements past the operative position. This problem may be overcome, for example, by modifying the filter device 63 as indicated in FIG. 15. In this modified arrangement, the generally rectangular filter elements F1, F2 and F3 of FIG. 11 are offset at their one end in the rotating direction of the filter device 63, with respect to their other end, such that the longer sides of the rectangle form a suitable angle $\theta$ to a straight line parallel to the axis of the filter device, as indicated in FIG. 15. In the other aspects, the modified rotary filter device of FIG. 15 are identical with that of FIG. 11.

Like the first and second darkrooms of the embodiments of FIGS. 1 and 3, the image-forming exposure section 60 and the basic exposure section 70 of the embodiment of FIG. 8 are separated from each other by a suitable partition wall.

The image transfer systems as shown in FIGS. 1, 3 and 8 may be used for a recorder of a facsimile system adapted to receive facsimile signals from a facsimile transmitter at a remote point. An example of such a facsimile system will be described referring to FIGS. 16 and 17.

Figure 16:
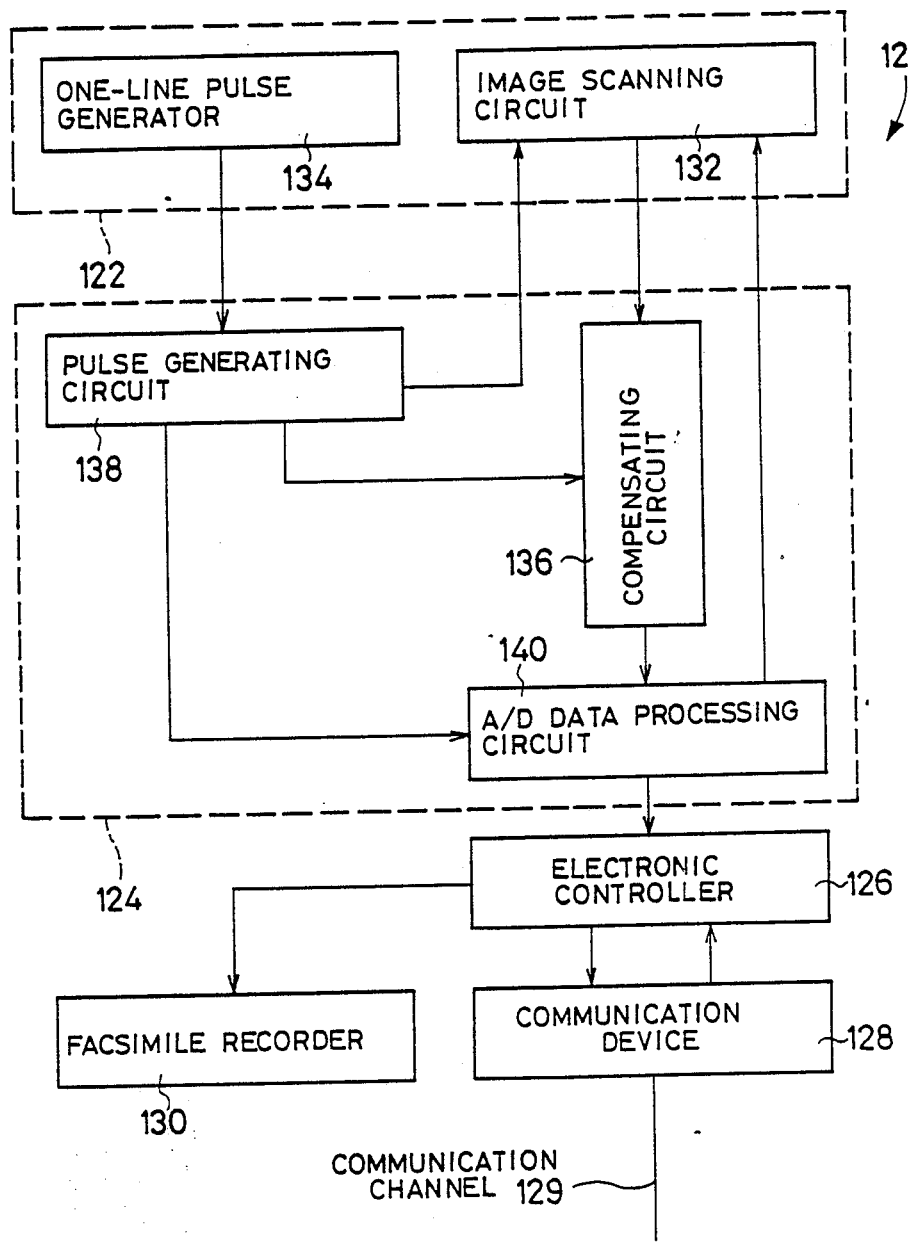
FIGS. 16 and 17 are schematic block diagrams showing an example of a facsimile system including a facsimile recorder in the form of the image transfer system as shown in FIG. 1, 3 or 8.

In FIG. 16, the facsimile system is indicated generally at 120. The facsimile system 120 includes: an image reader 122 for reading or scanning a subject copy; a signal processor 124 for shaping picture signals produced by the image reader 122, processing the shaped picture signals, and performing other functions; an electronic controller 126 for processing the picture signals from the signal processor 124; a communication device 128 for transmitting the facsimile signals from the electronic controller 126 to a remote facsimile receiver over a communication line 129, and receiving facsimile signals from the remote facsimile transmitter over the communication channel 129; and a facsimile recorder 130 which receives the facsimile signals from the remote facsimile transmitter via the communication device 128 and electronic controller 126, and converts the received facsimile signals to an image of a subject copy on the photosensitive paper 18, 48 which have been described.

The image reader 122 for reading a subject copy will be described in detail. As shown in FIG. 16, the image reader 122 includes an image scanning circuit 132, and a one-line pulse generator 134. Like a known ordinary image reader, the image scanning circuit 132 includes: a light source such as light-emitting diodes, for generating a light beam; a rod lens array such as self-focusing lenses for focusing the optical image signal (light beam influenced by an image on the subject copy) on an array of light-sensitive elements; the above-indicated light-sensitive elements, which are formed of CdS, CdSe, Se-As-Te or other suitable materials; a one-line register which receives image signals from the light-sensitive elements; and an amplifier for amplifying the image signals received by the one-line register. The one-line pulse generator 134 consists of an encoder and a photointerrupter.

The signal processor 124 includes: a compensating circuit 136 for shaping the waveform of the picture signals produced by the image scanning circuit 132; a pulse generating circuit 138 adapted to receive from the one-line pulse generator 134 of the image reader 122 a one-line pulse, and commands the image scanning circuit 132 to deliver the picture signals corresponding to one line of the image of the subject copy; and an A/D data processing circuit 140 for effecting binary or other processing of the shaped picture signals from the compensating circuit 136.

Figure 17:
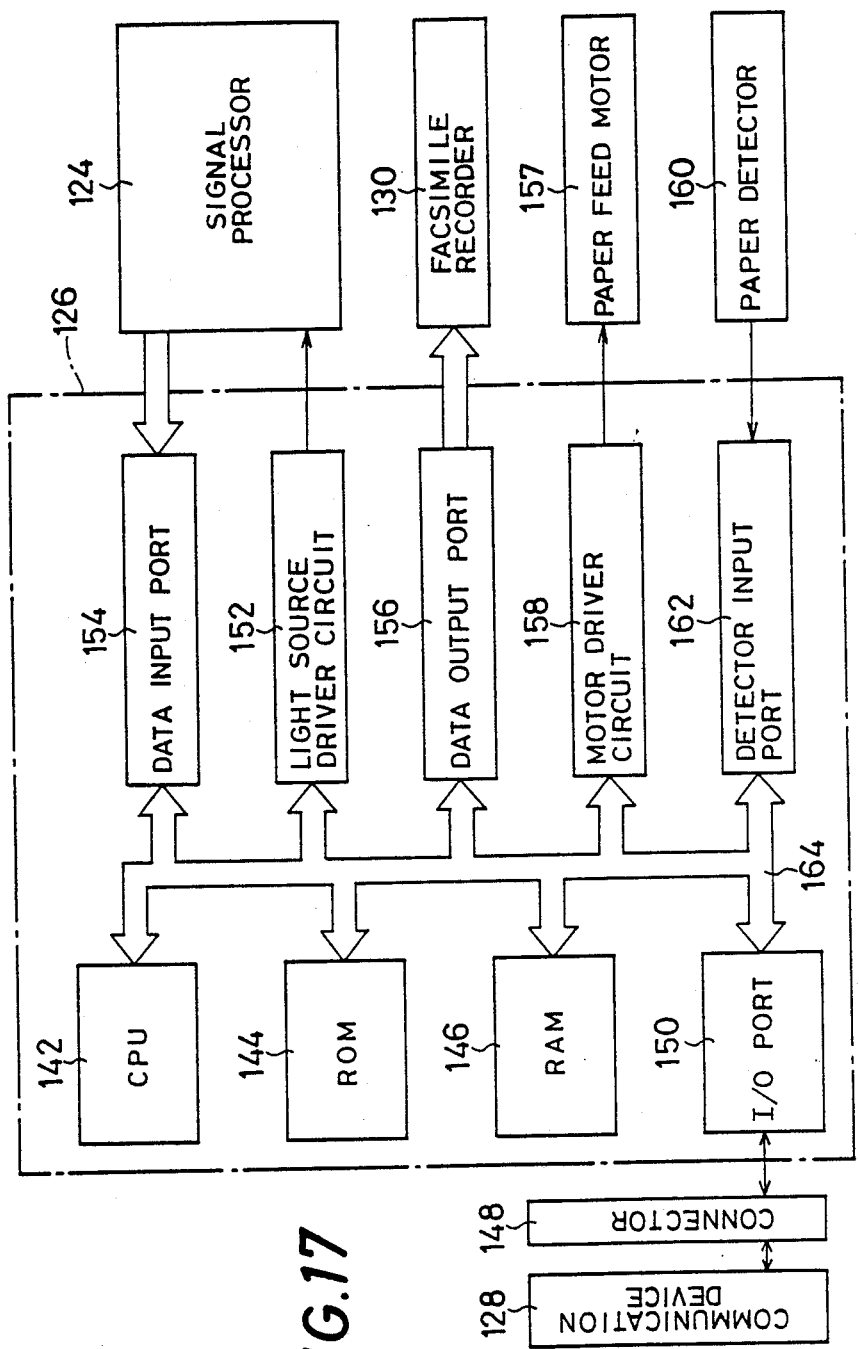

The electronic controller 126 for processing the signals from the A/D data processing circuit 140 will be described by reference to FIG. 17. As shown in this figure, the electronic controller 126 consists of a logic circuit arrangement which includes a CPU (central processing unit) 142, a ROM (read-only memory) 144, and a RAM (random access memory) 146. The CPU 142 operates according to a program stored in the ROM 144. The controller 126 further includes: a serial I/0 port 150 which is connected to the external communication channel 129 via a connector 148 and the transmitter/receiver 148; light-source driver circuit 152 adapted to apply a controlled drive signal to the light source of the image scanning circuit 132 via the signal processor 124, to energize the light source according to the drive signal, which represents an intensity of the light beam to be produced by the light source; a data input port 154 which receives the picture signals which have been generated by the image scanning circuit 132 and processed by the signal processor 124, such that the picture signals corresponding to one line of image of the subject copy are received by the data input port 154 at one time; a data output port 156 for applying the facsimile signals to the facsimile recorder 130; a motor driver circuit 158 for applying a controlled drive signal to a paper feed motor 157 for feeding the subject copy sheet in synchronization with the line scanning operation of the image scanning circuit 112 of the image reader 122; and a detector input port 162 adapted to receive a signal from a paper detector 160. The above-indicated CPU 142, ROM 144, RTAM 146, ports 150, 154, 156, 162 and driver circuits 152, 158 are interconnected with each other by a common bus 164. The paper feed motor 157 is also used for feeding the photosensitive paper 18, 48 used for the facsimile recorder 130.

The ROM 144 stores a data transmission program and a data reception program for transmitting and receiving facsimile signals to and from a remote facsimile system, in a commonly practiced manner.

The communication device 128 has two modes of operation, i.e., a transmission mode and a reception mode. In the transmission mode, the communication device 128 receives from the electronic controller 126 the picture signals which include both the direct-current component and the high-frequency component. The communication device 128 translates the received picture signals to facsimile signals suitable for transmission over the communication channel 129. In the reception mode, the communication device 128 translates the received facsimile signals into picture signals suitable for recording of the appropriate image by the facsimile recorder 130 on the photosensitive paper 18, 48. Thus, the communication device 128 includes a modulator/demodulator for conversion between the picture signals and the facsimile signals.

The facsimile recorder 130 is constructed as shown in FIG. 1, 3 or 8, for example. The electronic controller 126 has three modes of operation, i.e., a transmission mode, a reception mode, and a copy mode. The transmission and reception modes of the electronic controller 126 correspond to the transmission and reception modes of the communication device 128. In the copy mode, the electronic controller 126 applies the picture signals from the image reader 122 to the facsimile recorder 130. In the reception mode, the electronic controller 126 applies the picture signals received from the communication device 128, to the facsimile recorder 130. In the copy and reception modes, therefore, the electronic controller 126 serves as the image-signal generator 44 as shown in FIG. 1, or the picture signals generated from the electronic controller 126 serves as the IMAGE signal SG indicated in FIGS. 1 and 3. The facsimile recorder 130 operates to record an image on the photosensitive paper 18, 48, according to the picture signals received from the electronic controller 126, in the manner described above in detail with respect to the image transfer system by reference to FIGS. 1–15.

In the case where the facsimile recorder 130 is constructed as shown in FIG. 1, the lamp 26 in the first darkroom 14 is activated to expose the photosensitive paper 18 by an amount equal to El indicated in FIG. 7. Then, the photosensitive paper 18 is exposed to successive lines of light emitted from the fluorescent screen 34 of the CRT 28 according to the picture signals from the electronic controller 126, while the photosensitive paper 18 is fed through the second darkroom 16 by the paper feed motor 157. Thus, a latent image corresponding to the picture signals is formed on the photosensitive paper 18. As described above, the photosensitive paper 18 is first subjected to a preliminary exposure in the first darkroom 14 by the basic or minimum exposure amount El, and is then subjected to an image-forming exposure in the second darkroom 16 by the image-forming exposure device or CRT 28. Therefore, the amount of light that should be generated by the fluorescent screen 34 is only a difference between the total amount of light received by the photosensitive paper 18 for the formation of the latent image, and the basic minimum amount E1 obtained during the preliminary exposure by the lamp 26. Consequently, the required intensity of the light emitted by the fluorescent screen 34 can be accordingly reduced. Thus, the instant facsimile recorder or image transfer system 130 permits efficient formation of a latent image on the photosensitive paper 18, with reduced deterioration and improved durability of the fluorescent screen 34.

Further, the instant arrangement allows for a comparatively large relative variation in the level of the picture signals (IMAGE signal SG) which are applied to the CRT 28 to designate different densities of the corresponding picture elements of the image. In other words, the instant facsimile recorder 130 permits a comparatively high ratio of one picture signal to another, with the lowest level corresponding to the basic exposure amount El of FIG. 7, thus facilitating calibration of the image density.

In the case where the facsimile recorder 130 is constructed as shown in FIG. 3, the color-imaging photosensitive paper 48 is exposed to the radiations generated by the lamps 50C, 50M and 50Y in the first darkroom 14, by respective amounts EC1, EM1 and EY1 as indicated in FIG. 4. Then, in the second darkroom 16, the photosensitive paper 48 is exposed to the radiations produced by the fluorescent elements 54R, 54G and 54B of the color-imaging CRT 52, while the photosensitive paper 48 is fed through the second darkroom 16. Thus, a latent image corresponding to the received picture signals is formed on the photosensitive paper 48. In this case, too, the photosensitive paper 48 is first subjected to a preliminary exposure in the first darkroom 14 by the basic minimum amounts EC1, EM1 and EY1 by the respective lamps 50C, 50M and 50Y. Then, the photosensitive paper 48 is subjected to an image-forming exposure in the second darkroom 16 by the image-forming exposure device or CRT 52. Therefore, the required luminance of each fluorescent element 54R, 54G and 54B of the CRT 52 is equal to the total amount of exposure of the paper 48, less the basic minimum amount EC1, EM1 and EY1 provided by the respective basic exposure lamps 50C, 50M and 50Y. Accordingly, the image transfer or recording may be efficiently achieved with comparatively reduced levels of luminance of the fluorescent elements 54R, 54G and 54B. This results in reduced deterioration and improved life expectancy of the elements 54R, 54G and 54B.

Further, there is no need of adjusting the levels of the picture signals (IMAGE signal SG) for the cyan, magenta and yellow colors, for compensating for the differences in the basic minimum exposure amounts, since the microcapsules C, M and Y are subjected to the preliminary exposures by the different basic minimum amounts EC1, EM1 and EY1. Namely, the amounts of image-forming exposures by the image-forming CRT 52 are varied within substantially the same ranges, to obtain the same density-exposure relationships for the three types of microcapsules C, M and Y.

While the facsimile system 120 using the facsimile recorder 130 constructed as shown in FIG. 1, 3 or 8 has been illustrated above by way of example only, it is to be understood that the principle of the invention may be applied to other types of facsimile system, for example, a a facsimile system employing a laser printer wherein the image-forming exposure of the photosensitive paper 18, 48 after or prior to the preliminary exposure is effected by scanning with a laser beam.

Although the image transfer system according to the embodiments of FIGS. 1 and 3 has the preliminary exposure device and the image-forming exposure device in the first and second darkrooms 14, 16, respectively, the preliminary and image-forming exposure devices are disposed in the second and first darkrooms, 16, 14, respectively.

The photosensitive paper 18, 48, 67 used in the embodiments of FIGS. 1, 3 and 8 has a developer layer which is formed of a developing material capable of chemically reacting with the chrogenic material of the microcapsules. However, the developing material may be provided in the form of a separate developer sheet. In this case, the image-wise exposed photosensitive paper is superposed on the developer sheet, and the superposed photosensitive paper and developer sheet are passed through a pressure nip, for developing the latent image on the photosensitive paper into a visible image on the developer sheet.

While the present invention has been described in its presently preferred embodiments, it is to be understood that the invention is not limited to the precise details of the illustrated embodiments, but may be embodied with various changes and modifications that may occur to those skilled in the art, without departing from the spirit and scope of the invention defined in the following claims.

What is claimed is:

1. An image recording system comprising:
    a photosensitive medium having a layer of microcapsules formed on a substrate, each of said microcapsules including a photosensitive resin whose strength is varied upon exposure to a radiation, and a chromogenic material which is capable of chemically reacting with a developer material, to form a visible image;
    an exposing device for forming a latent image on said photosensitive medium according to image signals, by exposure of said medium to the radiation, said latent image being developed into a visible image;
    a communication device for translating facsimile signals into corresponding picture signals, said facsimile signals being received from a remote facsimile transmitter through a communication channel and representing an image of a subject copy; and
    control means connected to said communication device and said exposing device, for applying said picture signals as said image signals to said exposing device, and thereby forming on said photosensitive medium the latent image represented by said picture signals.

2. An image recording system according to claim 1, wherein said exposing device comprises:
    a first device for exposing said photosensitive medium to said radiation by a predetermined basic amount not larger than a basic minimum amount of exposure which substantially defines a lower limit of a density-variable range in which a density of said visible image is varied according to an amount of exposure of the photosensitive medium to said radiation;

a second device for exposing local areas of said photosensitive medium to a controlled intensity of said radiation represented by said image signals, and thereby cooperating with said first device to form said latent image on said photosensitive medium; and a developing device for developing said latent image on said photosensitive medium into said visible image.

3. An image recording system according to claim 2, wherein said first device and said second device use a single light source.

4. An image recording system according to claim 2, wherein said first device exposes said photosensitive medium before said second device exposes said photosensitive medium.

5. An image recording system according to claim 2, wherein said second device comprises a cathode ray tube operable to successively emit lines of light representative of corresponding lines of picture elements according to said image signals, and an optical focusing device disposed between said cathode ray tube and said photosensitive medium, for focusing said lines of light on said photosensitive medium.

6. An image recording system according to claim 2, wherein said photosensitive medium contains three different kinds of photosensitive materials which are sensitive to different wavelengths of said radiation corresponding to three primary colors, said first device exposing said photosensitive medium to said different wavelengths by different basic amounts.

7. An image recording system according to claim 6, wherein said first device includes three light sources operable for emitting rays of light having said different wavelengths, respectively.

8. An image recording system according to claim 1, further comprising an image reader for reading another subject copy and producing picture signals representative of an image of said another subject copy, and a signal processor for processing said picture signals from said image reader, so that the processed picture signals are applied as said image signals to said exposing device via said control means, to form said latent image on said photosensitive medium.

9. An image recording system, comprising:

a photosensitive medium having a layer of microcapsules formed on a substrate, said microcapsules comprising three groups of microcapsules which contain photosensitive materials which are sensitive to different wavelengths of a radiation corresponding to three primary colors, each of said microcapsules including a photosensitive resin whose strength is varied upon exposure to the radiation, and a chromogenic material which is capable of chemically reacting with a developer material, to form a visible image;

an exposing device for forming a latent image on said photosensitive medium according to image signals, by exposure of said medium to the radiation, said exposing device comprising a first device for exposing said photosensitive medium to said different wavelengths of the predetermined basic amounts not larger than a basic minimum amount of exposure which substantially defines a lower limit of a density-variable range in which a density of said visible image developed from said latent image is varied according to an amount of exposure of the photosensitive medium to said radiation, said exposing device further comprising a second device for exposing local areas of said photosensitive medium to a controlled intensity of said radiation represented by said image signals, and thereby cooperating with said first device to form said latent image on said photosensitive medium;

a developing device for developing said latent image on said photosensitive medium into said visible image;

a communication device for receiving facsimile signals representing an image of a subject copy, from a remote facsimile transmitter through a communication channel, and translating the received facsimile signals into corresponding picture signals;

control means connected to said communication device and said exposing device, for applying said picture signals as said image signals to said exposing device, and thereby forming on said photosensitive medium the latent image represented by said picture signals; and said second device of said exposing device comprising (a) a light source in the form of a bar for emitting a line of light, (b) a waveguide for directing said line of light toward said photosensitive medium, (c) a rotary filter device having three filter elements which are selectively brought into alignment with said waveguide by rotation of the rotary filter device about an axis thereof, said three filter elements converting said line of light from said light source into rays of light having said three different wavelengths, said rays of light being conducted through said waveguide, and (d) an optical switch array having a plurality of optical switches which are selectively opened according to said image signals, so as to permit said rays of light from said waveguide to pass through the selectively opened optical switches to expose corresponding areas of said photosensitive medium.

10. An image recording system according to claim 9, further comprising a drive motor for rotating said rotary filter device.

11. An image recording system according to claim 9, wherein each of said filter elements is inclined a predetermined angle relative to said line of light from said light source when said each filter is aligned with said waveguide, said each filter element having a substantially parallelogrammic shape as seen in a direction of propagation of said line of light through said waveguide.

12. An image recording system according to claim 9, wherein each of said filter elements has a generally rectangular stationary shield fixed thereto for interrupting said line of light from said light source, said shield extending parallel to said axis of rotation of the rotary filter device and having a width smaller than said each filter element.

13. An image recording system according to claim 12, wherein said stationary shield overlaps a portion of said each filter element as seen in a direction of rotation of said filter device.

14. An image recording system according to claim 12, wherein said each filter element further has a generally rectangular movable shield which extends parallel to said axis of rotation of the rotary filter device and has a smaller width than said each filter element in said direction of rotation, said movable shield being movable relative to said each filter element in a direction of rotation of said filter device, so as to overlap a portion of said each filter element for interrupting said line of light from said light source.

15. An image recording system, comprising:
a photosensitive medium having a layer of microcapsules formed on a substrate, each of said microcapsules including a photosensitive resin whose strength is varied upon exposure to a radiation, and a chromogenic material which is capable of chemically reacting with a developer material, to form a visible image;
an exposing device for forming a latent image on said photosensitive medium according to image signals, by exposure of said medium to the radiation, said exposing device comprising a first device for exposing said photosensitive medium to said radiation by a predetermined basic amount not larger than a basic minimum amount of exposure which substantially defines a lower limit of a density-variable range in which a density of said visible image developed from said latent image is varied according to an amount of exposure of the photosensitive medium to said radiation, said exposing device further comprising a second device for exposing local areas of said photosensitive medium to a controlled intensity of said radiation represented by said image signals, and thereby cooperating with said first device to form said latent image on said photosensitive medium, said first device exposing said photosensitive medium after said second device exposes said photosensitive medium;
a developing device for developing said latent image on said photosensitive medium into said visible image;
a communication device for receiving facsimile signals representing an image of a subject copy, from a remote facsimile transmitter through a communication channel, and translating the received facsimile signals into corresponding picture signals; and
control means connected to said communication device and said exposing device, for applying said picture signals as said image signals to said exposing device, and thereby forming on said photosensitive medium the latent image represented by said picture signals.

16. An image recording system, comprising:
a photosensitive medium having a layer of microcapsules formed on a substrate, said microcapsules comprising three groups of microcapsules which contain photosensitive materials which are sensitive to different wavelengths of a radiation corresponding to three primary colors, each of said microcapsules including a photosensitive resin the strength of which is varied upon exposure to the radiation, and a chromogenic material which is capable of chemically reacting with a developer material, to form a visible image;
an exposing device for forming a latent image on said photosensitive medium according to image signals, by exposure of said medium to the radiation, said exposing device comprising a first device for exposing said photosensitive medium to said different wavelengths of the predetermined basic amounts not larger than a basic minimum amount of exposure which substantially defines a lower limit of a density-variable range in which a density of said visible image developed from said latent image is varied according to an amount of exposure of the photosensitive medium to said radiation, said exposing device further comprising a second device for exposing local areas of said photosensitive medium to a controlled intensity of said radiation represented by said image signals, and thereby cooperating with said first device to form said latent image on said photosensitive medium;
said first device of said exposing device including a single light source for emitting said radiation, and a filter device including three filters operable for converting the radiation from said single light source into three rays of light having said different wavelengths;
a developing device for developing said latent image on said photosensitive medium into said visible image;
a communication device for receiving facsimile signals representing an image of a subject copy, from a remote facsimile transmitter through a communication channel, and translating the received facsimile signals into corresponding picture signals; and
control means connected to said communication device and said exposing device, for applying said picture signals as said image signals to said exposing device, and thereby forming on said photosensitive medium the latent image represented by said picture signals.

* * * * *